(12) United States Patent
Chen

(10) Patent No.: US 7,726,987 B2
(45) Date of Patent: Jun. 1, 2010

(54) CARD FIXER

(75) Inventor: Shih-Hung Chen, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 12/211,062

(22) Filed: Sep. 15, 2008

(65) Prior Publication Data

US 2009/0117763 A1  May 7, 2009

(30) Foreign Application Priority Data

Nov. 7, 2007  (TW) ............................. 96142058 A

(51) Int. Cl.
*H01R 13/44* (2006.01)
(52) U.S. Cl. ..................... 439/148; 439/945; 439/630
(58) Field of Classification Search ............... 439/148, 439/630, 945, 946
See application file for complete search history.

(56) References Cited

U.S. PATENT DOCUMENTS

| 6,269,005 | B1 * | 7/2001 | Tung et al. ................. 361/737 |
| 6,602,096 | B1 * | 8/2003 | Kronestedt et al. .......... 439/630 |
| 7,083,441 | B1 * | 8/2006 | Lee ............................ 439/148 |
| 2006/0088307 | A1 | 4/2006 | Harasawa et al. |
| 2007/0021010 | A1 * | 1/2007 | Chen et al. ................. 439/630 |

* cited by examiner

*Primary Examiner*—Tho D Ta
*Assistant Examiner*—Travis Chambers
(74) *Attorney, Agent, or Firm*—Jianq Chyun IP Office

(57) ABSTRACT

A card fixer is suitable to assist a card to be fixed in a slot of an electronic device. The card fixer includes a body and a clipping structure, wherein the body has a first side and a second side parallel to the first side. A hook is disposed on the first side of the body. The clipping structure extends out of the second side of the body for clipping the card thereon. When the clipping structure of the card fixer clips the card and the assembly of the card fixer with the card is inserted into the slot, the hook is locked on an inside wall of the slot.

12 Claims, 7 Drawing Sheets

CARD FIXER

CROSS-REFERENCE TO RELATED APPLICATION

This application claims the priority benefit of Taiwan application serial no. 96142058, filed on Nov. 7, 2007. The entirety of the above-mentioned patent application is hereby incorporated by reference herein and made a part of this specification.

BACKGROUND OF THE INVENTION

1. Field of the Invention

The present invention generally relates to a fixer, and more particularly, to a card fixer for assisting a card to be fixed in a slot of an electronic device.

2. Description of Related Art

Along with the progresses of science and technologies, electronic devices are more and more widespread in numerous applications, for example, served as a laptop computer. Differently from a general electronic device, in order to conveniently carry a laptop computer, the product dimensions thereof are usually designed in pursuit of light-slim-short-small tendency so as to provide a user with handiness.

Usually, a laptop computer is equipped only with board cards required for basic functions therein so as to compact the size and carry conveniently. Therefore as a general rule, at least an expansion socket is disposed on the body of an expansion laptop computer to expand the functions thereof. For example, an express card can be used and inserted into the expansion slot to enhance the functions of a laptop computer.

Note that an expansion card has different sizes depending on different functions thereof; for example, the above-mentioned express card has two kinds of interfaces based on PCI Express standard and USB 2.0 standard respectively, and has two sizes of 34 mm and 54 mm. A general laptop computer has at least an expansion slot, which is able to accommodate the above-mentioned express card with two different sizes. However, when an expansion card with the smaller size is inserted into the slot by a user, the dimension of the card does not match the accommodating space of the slot. Thus, the expansion card may get loosened, detached or displaced from the slot during moving the laptop computer or due to shaking, which results in poor contact between the expansion card and the slot. In particular, when an expansion card with the small size is externally connected to a transmission cable, the cable is easily pulled and dragged by an improper external force, which may further result in that the expansion card with the small size connected to the transmission cable is detached from the slot and thereby affect the operation efficiency of a laptop computer.

SUMMARY OF THE INVENTION

Accordingly, the present invention is directed to a card fixer capable of firmly fixing a card in a slot of an electronic device.

The present invention provides a card fixer, which is suitable to assist a card to be fixed in a slot of an electronic device. The card fixer includes a body and a clipping structure, wherein the body has a first side and a second side parallel to the first side. A hook is disposed on the first side of the body. The clipping structure extends out of the second side of the body for clipping the card thereon. When the clipping structure of the card fixer clips the card and the card fixer with the card is inserted into the slot, the hook is locked on an inside wall of the slot, which further makes the card firmly inserted in the slot.

In an embodiment of the present invention, when the assembly of the card fixer and the card is inserted in the slot, the clipping structure is located at the outer side of the slot.

In an embodiment of the present invention, the card fixer further includes a sliding part, which is disposed in sliding way on the body and able to slide along a path, wherein the sliding part includes at least a locking portion. When the assembly of the card fixer and the card is inserted in the slot and the sliding part slides along the path towards the inside of the electronic device, the locking portion suits to move from inside the first side of the body to outside the first side and closely contacts the inside wall of the slot.

In an embodiment of the present invention, the sliding part further includes a force-exerting portion, and when the assembly of the card fixer and the card is inserted in the slot, the force-exerting portion is located at the outer side of the slot.

In an embodiment of the present invention, the sliding part further includes at least a first guiding element, the body further has at least a second guiding element formed correspondingly to the first guiding element, and the sliding part reciprocating slides on the path by means of the fit between the first guiding element and the second guiding element.

In an embodiment of the present invention, the first guiding element is a guiding cylinder and the second guiding element is a guiding groove.

In an embodiment of the present invention, the first guiding element is a guiding groove and the second guiding element is a guiding cylinder.

In an embodiment of the present invention, the hook is an elastic hook.

In an embodiment of the present invention, the clipping structure has a clipping portion to clip the card on a side edge of the body.

In an embodiment of the present invention, the card is an expansion card and the slot is an expansion socket.

The present invention utilizes a card fixer to assist a card to be fixed in a slot of an electronic device so that the card can be firmly inserted in the slot to avoid inconvenience of usage or damage of components due to moving the electronic device or pulling and dragging the cable connected to the electronic device by an external force.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
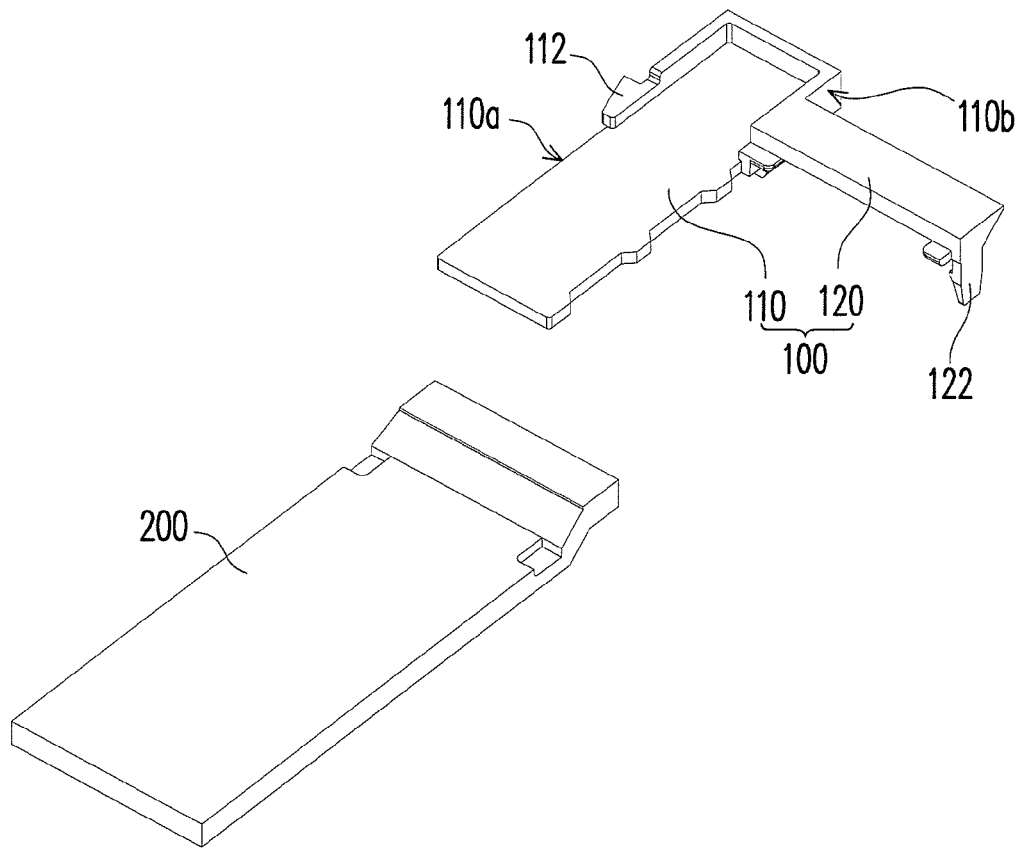
FIG. 1A is an exploded diagram of a card fixer and a card according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
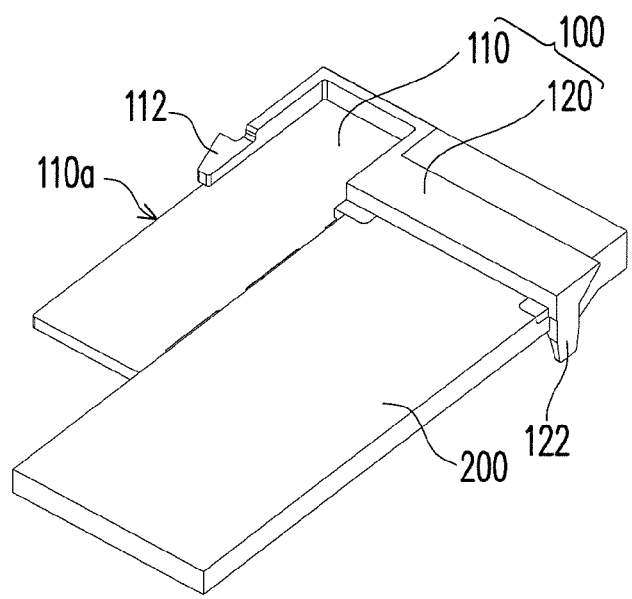
FIG. 1B is a diagram showing the assembly of the card fixer and the card in FIG. 1A.

FIG. 1A is an exploded diagram of a card fixer and a card with a smaller size according to an embodiment of the present invention and FIG. 1B is a diagram showing the assembly of the card fixer and the card with the smaller size in FIG. 1A. Referring to FIGS. 1A and 1B, a card fixer 100 of the embodiment mainly includes a body 110 and a clipping structure 120. The body 110 has a first side 110a and a second side 110b parallel to the first side 110a. A hook 112 is disposed on the first side 110a of the body 110 and the hook 112 is, for example, an elastic hook. The clipping structure 120 extends out of the second side 110b of the body 110 and is able to clip a card 200, especially a card with a smaller size, thereon. In the embodiment, the card with a smaller size can be an express card with 34 mm width.

In more detail, the clipping structure 120 extending out of the second side 110b of the body 110 in the embodiment has a width, which is so large just to fix a card. The sum of the width of the body 110 and the width of the clipping structure 120 is just equal to the width of the slot on an electronic device, i.e., the width of a vendible card with a larger size.

The clipping structure 120 preferably crosses over the card 200 and uses a clipping portion 122 to lock and clip the card 200 on a side edge of the body 110. In this way, the card fixer 100 is able to effectively assist the card 200 to be inserted in the slot of an electronic device and eliminate any space to tolerate moving in the slot. The mechanism for the card 200 to be firmly fixed in the slot by using the card fixer 100 is explained hereinafter.

Figure 2A:
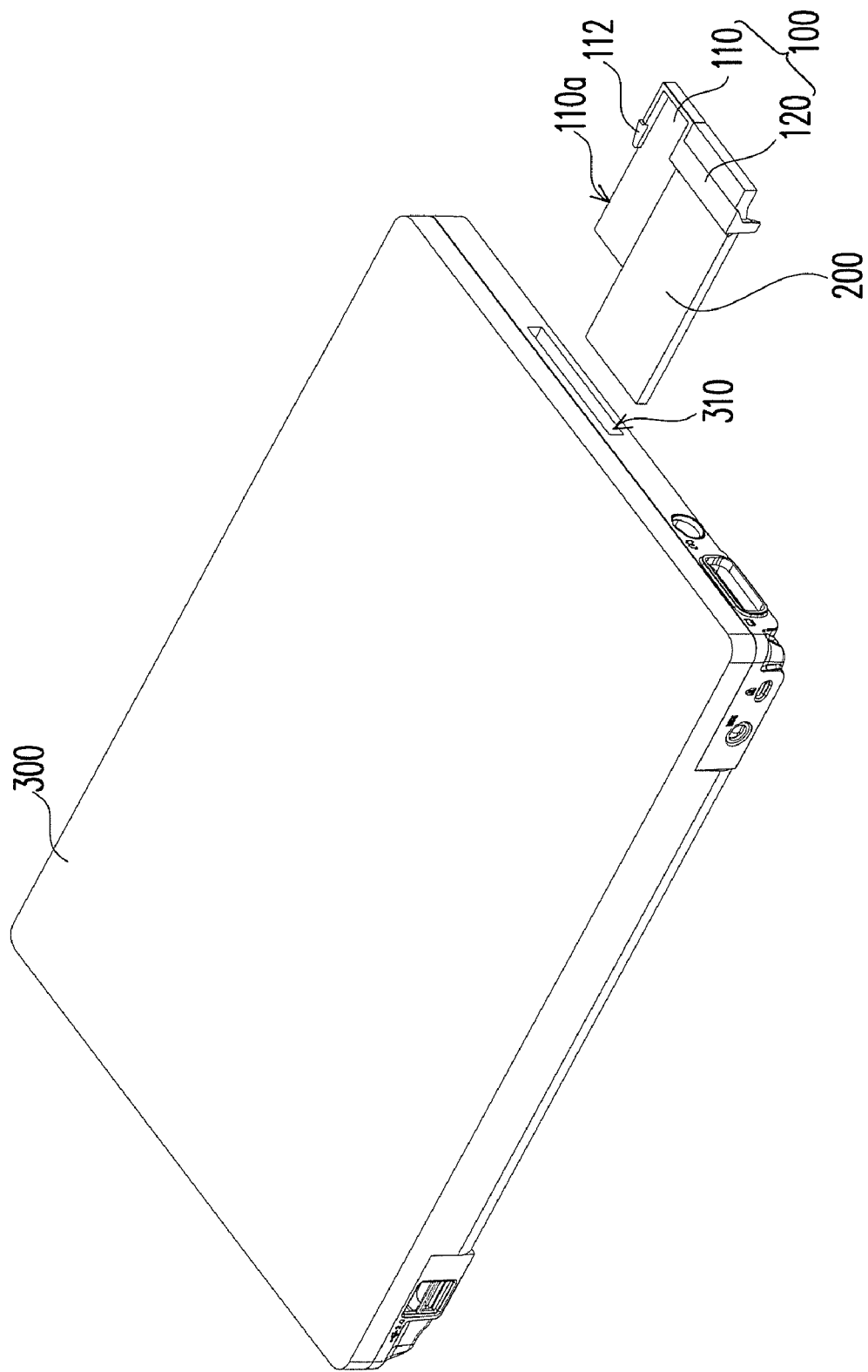
FIG. 2A is a diagram showing the assembly of the card fixer and the card in FIG. 1B and an electronic device.
Figure 2B:
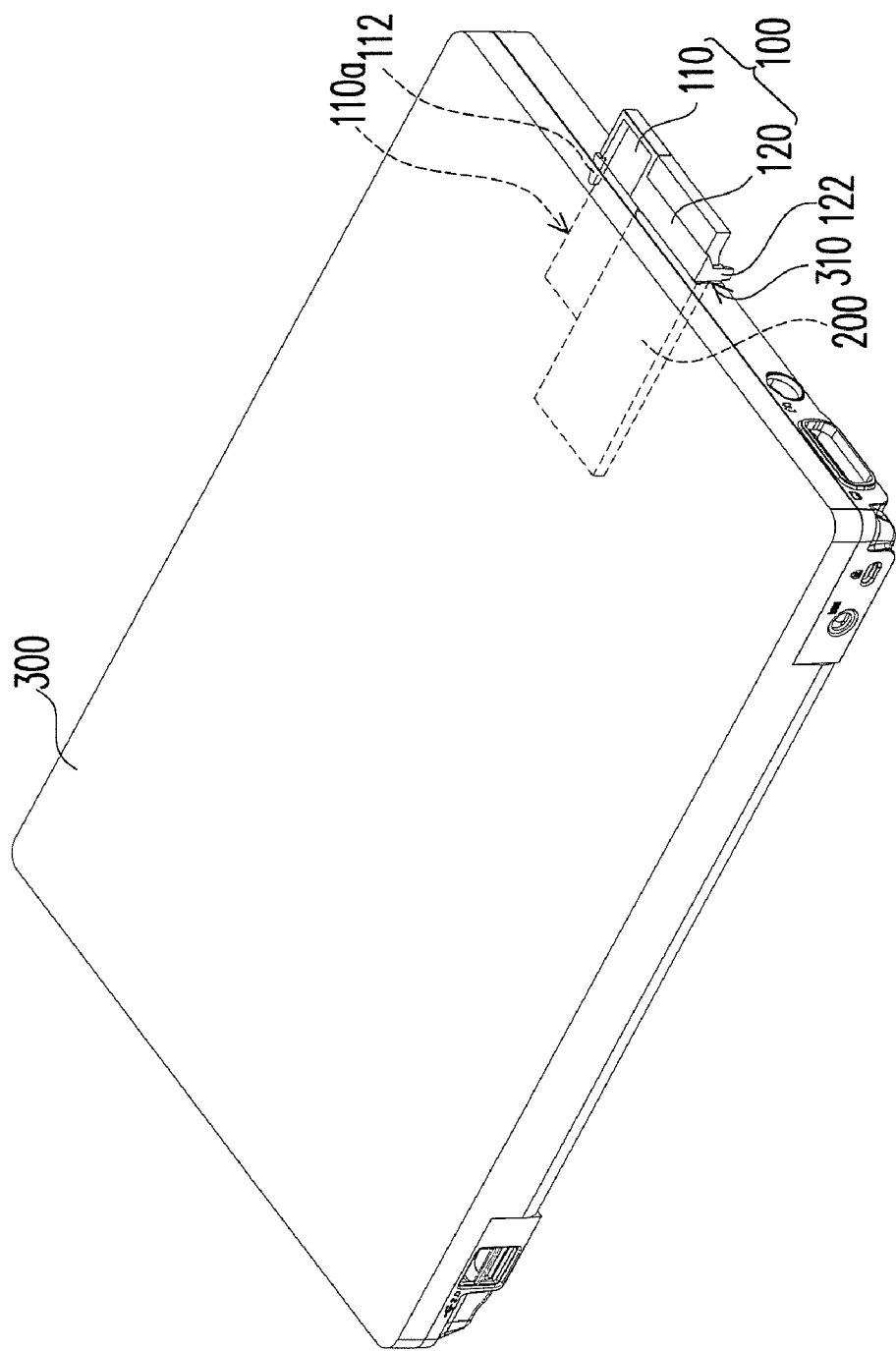
FIG. 2B is a diagram showing the assembly of the card fixer and a card in FIG. 1B together inserted in the slot of the electronic device.

FIG. 2A is a diagram showing the card fixer with the card in FIG. 1B and an electronic device having an expansion socket, and FIG. 2B is a diagram showing the assembly of the card fixer and a card in FIG. 1B together inserted in the slot of the electronic device.

Referring to FIGS. 2A and 2B, in the embodiment, the electronic device 300 is, for example, a laptop computer, wherein the slot 310 is, for example, an expansion socket or a slot of other types, and the width of the slot complies with the size of a general vendible express card with 54 mm width. When a card 200 is locked on the card fixer 100 of the embodiment and the assembly thereof is inserted in the slot 310, the width of the assembly of the card fixer 100 and the card 200 is equal to the width of the slot 310, so that the space between the card 200 and the slot 310 is filled up by the body 110 of the card fixer 100. Thus, the situation can be avoided where a card 200 with a smaller size is narrower than the width of the slot 310, and thereby the card is easily moved and even detached from the slot 310 due to a mismatching accommodating space.

In addition, a hook 112 is disposed on the first side 110a of the body 110 and suits to be locked on an inside wall of the slot 310, so that when the clipping structure 120 clips the card 200 and the assembly of the card fixer 100 and the card 200 is inserted in the slot 310, the card fixer 100 is able to firmly fix the card 200 in the slot 310 by the locking engagement between the hook 112 and the inside wall of the slot 310; meanwhile, the electronic device 300 can keep a preferred work state to effectively read the card 200.

Since the hook 112 in the embodiment is, for example, an elastic hook, a user is required to merely press down a part of the body 110 adjacent to the hook 112 in order to take out the card 200 from the slot 310, where the hook 112 gets an elastic deformation to be released from the inside wall of the slot 310 and the user can easily take out the assembly of the card fixer 100 and the card 200 from the slot 310.

Figure 3A:
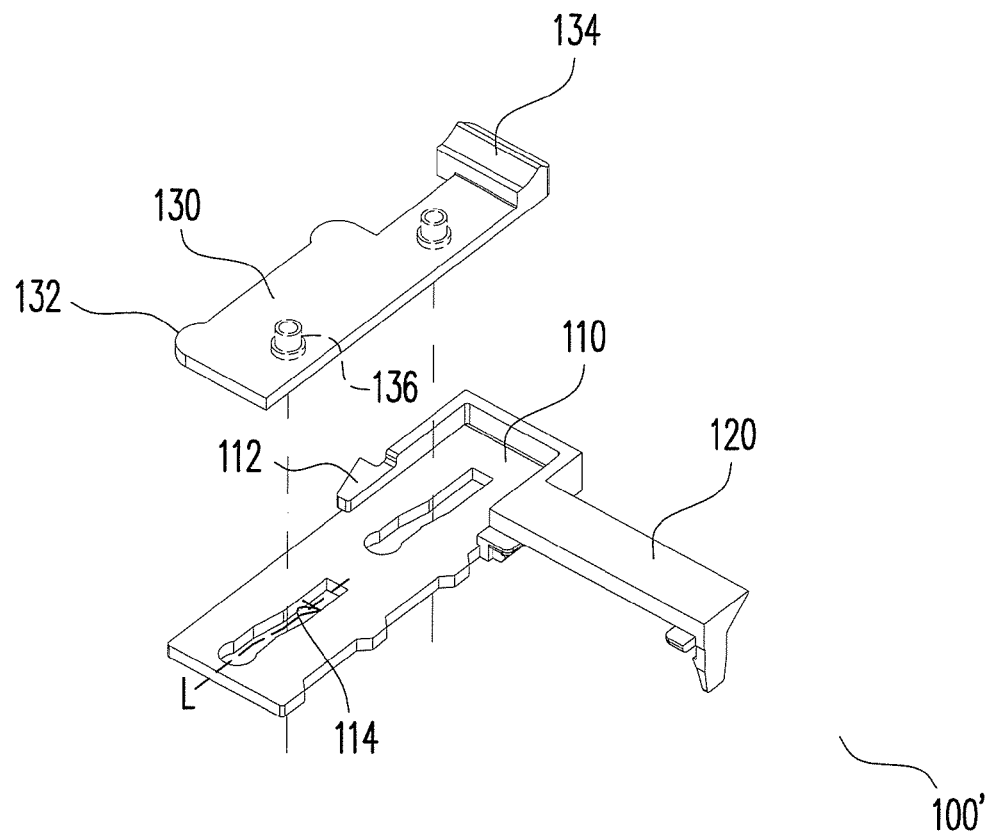
FIG. 3A is an exploded diagram of a card fixer according to another embodiment of the present invention.
Figure 3B:
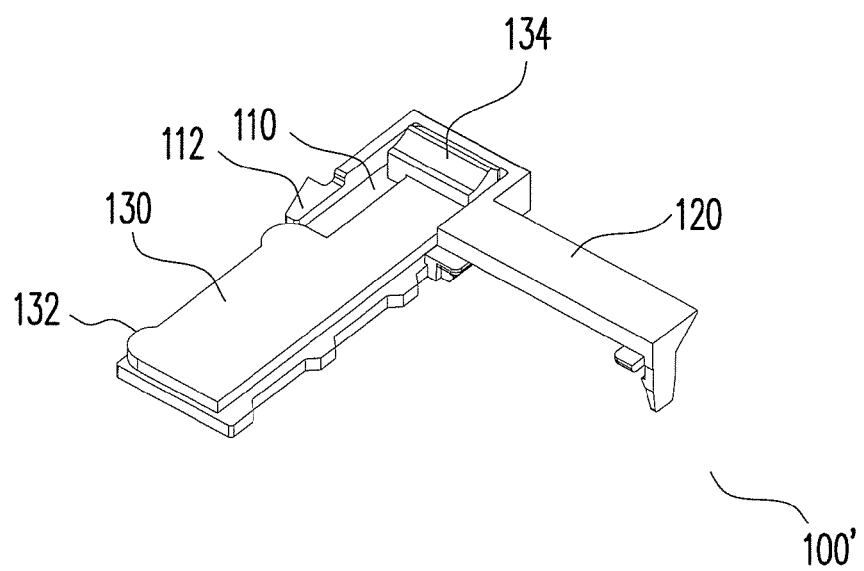
FIG. 3B is an assembly diagram of the card fixer of FIG. 3A.

In order to more firmly insert a card in a slot, the present invention further provides a card fixer according to another embodiment. Referring to FIGS. 3A and 3B (FIG. 3A is an exploded diagram of a card fixer according to another embodiment of the present invention and FIG. 3B is an assembly diagram of the card fixer of FIG. 3A), the card fixer 100' in the embodiment is similar to the above-mentioned card fixer 100 except the card fixer 100' herein further includes a sliding part 130 disposed in sliding way on the body 110.

In the embodiment, the sliding part 130 has at least a locking portion 132 and suits to slide along a path L (for example, a slightly-curved path instead of a straight path). When the sliding part 130 herein slides along the path L, the locking portion 132 of the sliding part 130 suits to move from inside the first side 110a to outside the first side 110a. Thus, during the sliding part 130 is sliding along the path L, the locking portion 132 originally located inside the first side 110a would be protruded from the first side 110a of the body 110 (referring to FIG. 3C, a diagram from another point of view showing the sliding part in FIG. 3A moving along a path).

In more detail in the embodiment, for example, a force-exerting portion 134 and at least a first guiding element 136 are disposed on the sliding part 130 (in FIG. 3A, two first guiding elements 136 are exemplarily disposed), and at least a second guiding element 114 corresponding to the first guiding element 136 is disposed on the body 110 (in FIG. 3A, two second guiding elements 114 are exemplarily disposed). After a user handles the force-exerting portion 134, the sliding part 130 can reciprocating slide along the path L by means of the fit between the first guiding element 136 and the second guiding element 114.

In the embodiment, the first guiding element 136 is, for example, a guiding cylinder and the second guiding element 114 is, for example, a guiding groove designed following the path L; and the sliding part 130 having the guiding cylinder can slide along the path L under the guiding of the groove. In other embodiments however, the first guiding element 136 is alternatively, for example, a guiding groove and the second guiding element 114 is, for example, a guiding cylinder, which the present invention is not limited to.

Figure 3C:
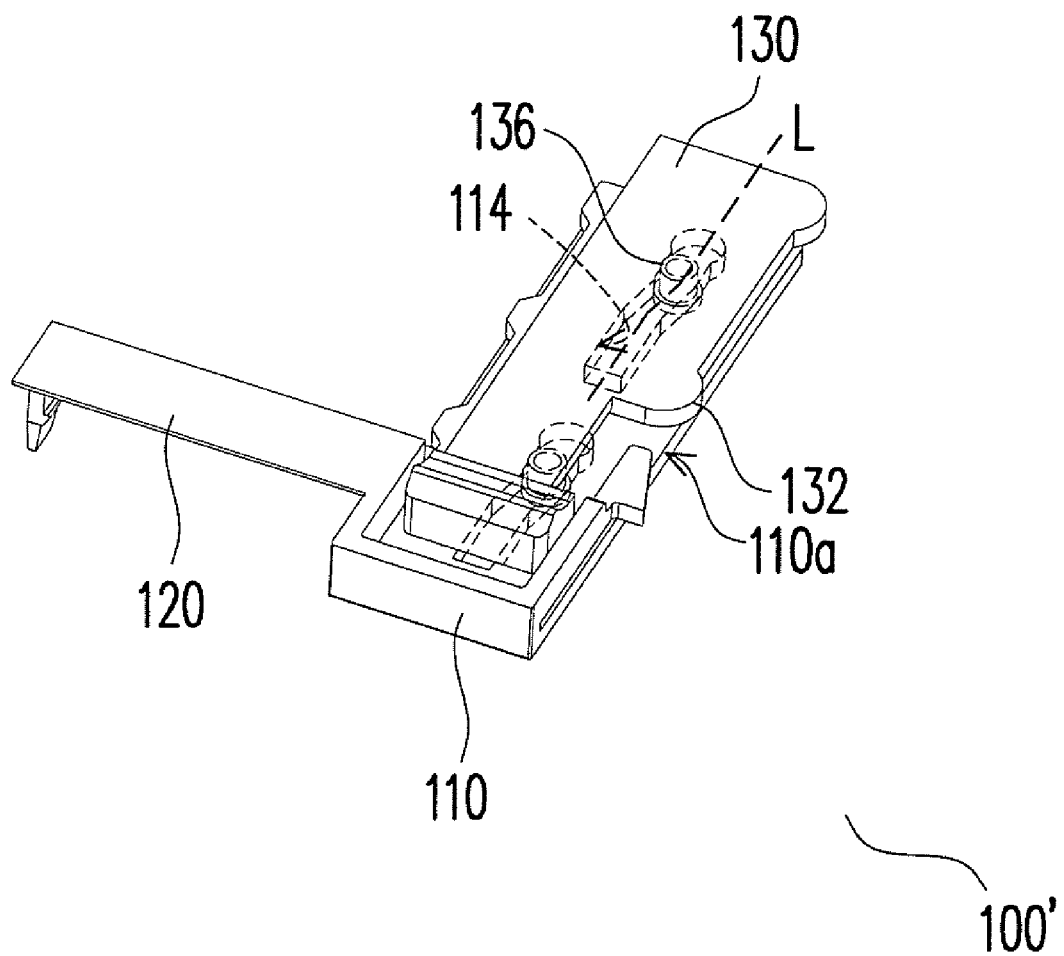
FIG. 3C is a diagram from another point of view showing the sliding part in FIG. 3A moving along a path.
Figure 4A:
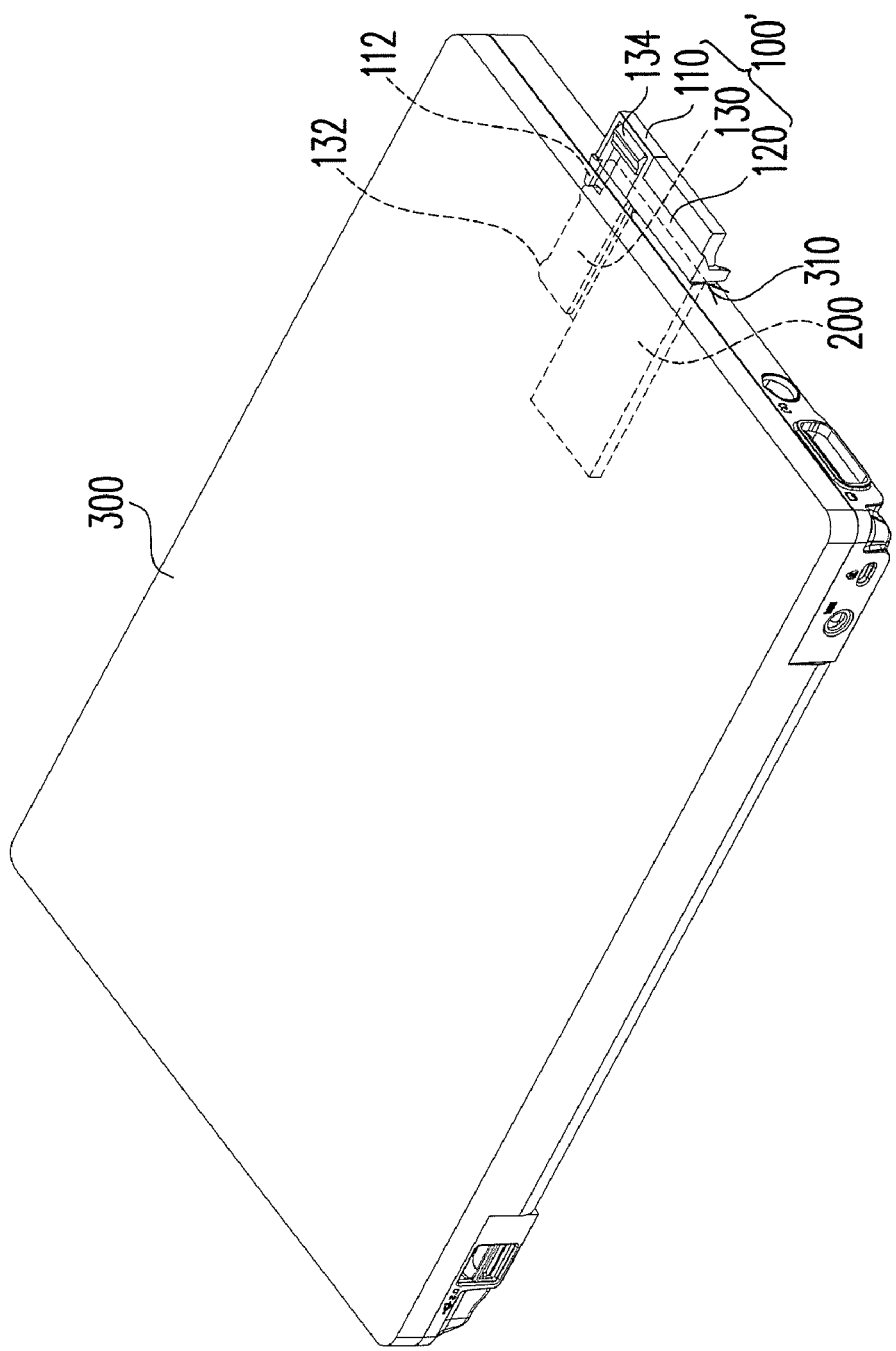
FIG. 4A is a diagram showing the assembly of the card fixer and a card in FIG. 3B together inserted in the slot of an electronic device.
Figure 4B:
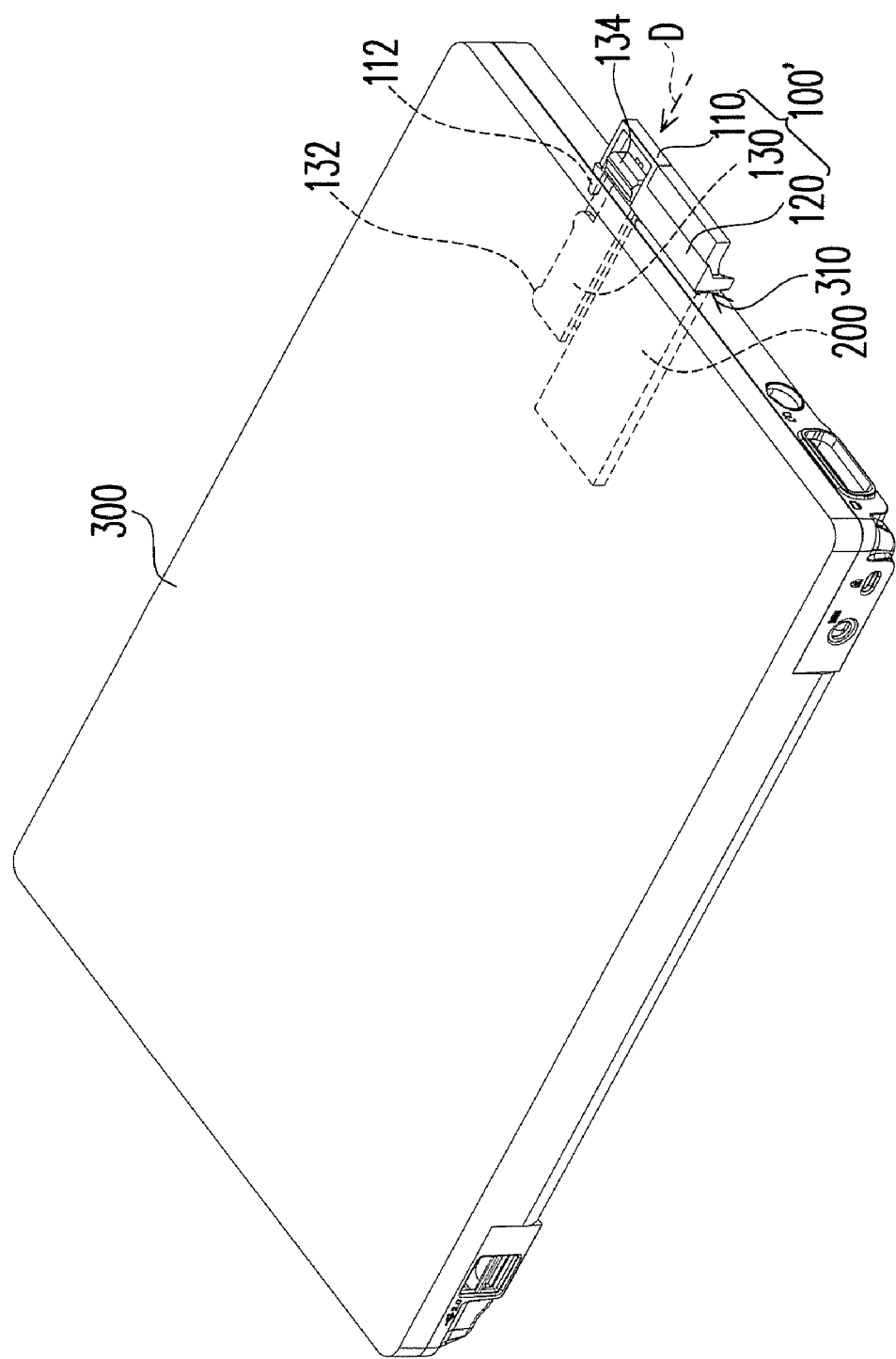
FIG. 4B is a diagram showing the sliding part in FIG. 4A after being pushed by a user.

Referring to FIGS. 3C, 4A and 4B, wherein FIG. 4A is a diagram showing the assembly of the card fixer and a card in FIG. 3B together inserted in the slot of an electronic device and FIG. 4B is a diagram showing the sliding part in FIG. 4A after being pushed by a user.

In the embodiment, when the assembly of the card fixer 100' and the card 200 is inserted in the slot 310, the force-exerting portion 134 is, for example, located at the outer side of the slot 310 for a user to conveniently push it. When the user pushes the force-exerting portion 134 along a direction D towards inside the electronic device 300, the sliding part 130 slides along the path L towards inside the electronic device 300. Meanwhile, the locking portion 132 originally located inside the first side 110*a* of the body 110 would be protruded out of the first side 110*a* of the body 110 along with moving the sliding part 130, and then closely contact the inside wall of the slot 310, which makes the card fixer 100' more firmly inserted in the slot 310.

Specifically, since the space between the card 200 and the slot 310 has been effectively filled up by the body 110 of the card fixer 100', the locking portion 132 protruded out of the first side 110*a* due to moving the sliding part 130 makes the overall dimension of the card fixer 100' in the slot 310 slightly larger. As a result, the card fixer 100' more closely contacts the inside wall of the slot 310 and the card 200 clipped by the card fixer 100' is accordingly more firmly inserted in the slot 310.

In summary, the present invention uses a card fixer to assist a card, especially a card with a smaller size, to be inserted in the slot of an electronic device. The card fixer herein mainly comprises a body having a hook and a clipping structure for clipping the card. When the clipping structure of the card fixer clips the card with a smaller size and then is together inserted in the slot, the space between the card and the slot is filled up by the body, which can reduce any rock caused by the mismatching between the card dimension and the slot space. The hook disposed on the body can be locked on the inside wall of the slot, therefore, the assembly of the card fixer and the card can be firmly fixed in the slot. In other words, a card with a smaller size can be firmly inserted in a slot by using the card fixer of the present invention.

In addition, a sliding part can be disposed on the body of the present invention, so that a user can push the sliding part to make the locking portion disposed on the sliding part protruded out of the body, which further makes the overall dimension of the card fixer in the slot slightly larger. As a result, the card fixer more closely contacts the inside wall of the slot and the card clipped by the card fixer is accordingly more firmly inserted in the slot. In short, the electronic device with a card inserted therein can more stably work.

Moreover, the card fixer of the present invention can effectively assist a card to be fixed in the slot of an electronic device, which is especially advantageous for a card with a smaller size, where even though the card is externally connected to a transmission cable, the card is unlikely detached from the slot due to pulling or dragging the transmission cable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A card fixer, suitable to assist a card to be fixed in a slot of an electronic device, wherein the slot suitable to accommodate different size cards, the card fixer comprising:

a body, having a first side and a second side parallel to the first side, wherein a hook is disposed on the first side; and a clipping structure, extending out of the second side for clipping the card, when the clipping structure clips the card, the clipping structure crossing over from one side of the card to an opposite side of the card, and the assembly of the card fixer and the card is inserted into the slot, the hook is locked on an inside wall of the slot.

2. The card fixer according to claim 1, wherein when the assembly of the card fixer and the card is inserted in the slot, the clipping structure is located at the outer side of the slot.

3. The card fixer according to claim 1, wherein the hook is an elastic hook.

4. The card fixer according to claim 1, wherein the clipping structure has a clipping portion to clip the card on a side edge of the body.

5. The card fixer according to claim 1, wherein the card is an expansion card and the slot is an expansion socket.

6. The card fixer according to claim 1, wherein the width of the card is less than the width of the slot.

7. The card fixer according to claim 1, wherein the sum width of the body and the clipping structure is just equal to the width of the slot.

8. The card fixer according to claim 1, further comprising a sliding part disposed in sliding way on the body and able to slide along a path, wherein the sliding part comprises at least a locking portion, when the assembly of the card fixer and the card is inserted in the slot and the sliding part slides along the path towards the inside of the electronic device, the locking portion suits to move from inside the first side of the body to outside the first side and closely contacts the inside wall of the slot.

9. The card fixer according to claim 8, wherein the sliding part further comprises a force-exerting portion, and when the assembly of the card fixer and the card is inserted in the slot, the force-exerting portion is located at the outer side of the slot.

10. The card fixer according to claim 8, wherein the sliding part further comprises at least a first guiding element, the body further has at least a second guiding element formed correspondingly to the first guiding element, and the sliding part reciprocating slides on the path by means of the fit between the first guiding element and the second guiding element.

11. The card fixer according to claim 10, wherein the first guiding element is a guiding cylinder and the second guiding element is a guiding groove.

12. The card fixer according to claim 10, wherein the first guiding element is a guiding groove and the second guiding element is a guiding cylinder.

\* \* \* \* \*